(12) United States Patent
Wang et al.

(10) Patent No.: US 10,096,706 B2
(45) Date of Patent: *Oct. 9, 2018

(54) VERTICAL DEVICE ARCHITECTURE

(71) Applicant: Taiwan Semiconductor Manufacturing Co., Ltd., Hsin-Chu (TW)

(72) Inventors: Chih-Hao Wang, Baoshan Township (TW); Jhon Jhy Liaw, Zhudong Township (TW); Wai-Yi Lien, Hsinchu (TW); Jia-Chuan You, Dayuan Township (TW); Yi-Hsun Chiu, Zhubei (TW); Ching-Wei Tsai, Hsinchu (TW); Wei-Hao Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/615,195

(22) Filed: Jun. 6, 2017

(65) Prior Publication Data

US 2017/0271510 A1 Sep. 21, 2017

Related U.S. Application Data

(63) Continuation of application No. 14/318,835, filed on Jun. 30, 2014, now Pat. No. 9,698,261.

(51) Int. Cl.
*H01L 29/78* (2006.01)
*H01L 29/66* (2006.01)
(Continued)

(52) U.S. Cl.
CPC ...... *H01L 29/7827* (2013.01); *H01L 27/0688* (2013.01); *H01L 27/1158* (2013.01);
(Continued)

(58) Field of Classification Search
CPC ............. H01L 21/8221; H01L 27/0688; H01L 27/11556; H01L 27/1158; H01L 27/11582;
(Continued)

(56) References Cited

U.S. PATENT DOCUMENTS 6,077,745 A 6/2000 Burns, Jr. et al.
6,603,168 B1 8/2003 Choi
(Continued)

FOREIGN PATENT DOCUMENTS

JP 2005285809 A 10/2005
KR 1020090017045 A 2/2009
KR 100896631 B1 5/2009

OTHER PUBLICATIONS

Hellemans, Alexander. "Nanowire Transistors Could Keep Moore's Law Alive." IEEE Spectrum, Apr. 29, 2013.
(Continued)

*Primary Examiner* — Bac Au
(74) *Attorney, Agent, or Firm* — Eschweiler & Potashnik, LLC

(57) ABSTRACT

In some embodiments, the present disclosure relates to a vertical transistor device, and an associated method of formation. The transistor device has a source region over a substrate and a vertical channel bar over the source region. The vertical channel bar has a bottom surface with an elongated shape. A conductive gate region is separated from sidewalls of the vertical channel bar by a gate dielectric layer. The conductive gate region has a vertical leg and a horizontal leg protruding outward from a sidewall of the vertical leg. A dielectric layer vertically extends from a plane extending along an uppermost surface of the conductive gate region to a position surrounded by the conductive gate region. A drain contact is over the vertical channel bar.

20 Claims, 11 Drawing Sheets

(51) Int. Cl.
*H01L 27/11582* (2017.01)
*H01L 27/11556* (2017.01)
*H01L 27/06* (2006.01)
*H01L 29/788* (2006.01)
*H01L 29/792* (2006.01)
*H01L 27/1158* (2017.01)
*H01L 27/11* (2006.01)
*H01L 21/822* (2006.01)

(52) U.S. Cl.
CPC .. *H01L 27/11556* (2013.01); *H01L 27/11582* (2013.01); *H01L 29/66666* (2013.01); *H01L 29/7889* (2013.01); *H01L 29/7926* (2013.01); *H01L 21/8221* (2013.01); *H01L 27/1104* (2013.01)

(58) Field of Classification Search
CPC ............. H01L 29/7889; H01L 29/7926; H01L 29/66666; H01L 29/7827
See application file for complete search history.

(56) References Cited

U.S. PATENT DOCUMENTS

| | | |
|---|---|---|
| 7,425,491 B2 | 9/2008 | Forbes |
| 8,063,441 B2 | 11/2011 | Son et al. |
| 8,063,450 B2 | 11/2011 | Wernersson et al. |
| 8,890,119 B2 | 11/2014 | Doyle et al. |
| 8,928,074 B2 * | 1/2015 | Cheng .................. H01L 29/8083 257/287 |
| 9,177,867 B2 | 11/2015 | Pradhan et al. |
| 9,698,261 B2 * | 7/2017 | Wang .................. H01L 29/7827 |
| 2004/0166642 A1 | 8/2004 | Chen et al. |
| 2007/0232007 A1 | 10/2007 | Forbes |
| 2007/0295995 A1 | 12/2007 | Yun et al. |
| 2008/0283912 A1 | 11/2008 | Shibata et al. |
| 2010/0155818 A1 | 1/2010 | Cho et al. |
| 2011/0012085 A1 | 1/2011 | Deligianni et al. |
| 2013/0240983 A1 | 9/2013 | Larrieu |
| 2014/0106523 A1 | 4/2014 | Koldiaev et al. |
| 2015/0091058 A1 | 4/2015 | Doyle et al. |
| 2015/0380539 A1 | 12/2015 | Colinge et al. |

OTHER PUBLICATIONS

Non-Final Office Action dated Feb. 26, 2016 for U.S. Appl. No. 14/318,835.

Final Office Action dated Dec. 15, 2016 for U.S. Appl. No. 14/318,835.

Notice of Allowance dated Mar. 1, 2017 for U.S. Appl. No. 14/318,835.

* cited by examiner

VERTICAL DEVICE ARCHITECTURE

REFERENCE TO RELATED APPLICATION

This Application is a Continuation of U.S. application Ser. No. 14/318,835 filed on Jun. 30, 2014, the contents of which are hereby incorporated by reference in their entirety.

BACKGROUND

Moore's law states that the number of transistors in an integrated circuit doubles approximately every two years. To achieve Moore's law, the integrated chip industry has continually decreased the size of (i.e., scaled) integrated chip components. However, in recent years, scaling has become more difficult, as the physical limits of materials used in integrated chip fabrication are being approached. Thus, as an alternative to traditional scaling the semiconductor industry begun to use alternative technologies (e.g., FinFETs) to continue to meet Moore's law.

One alternative to traditional silicon planar field effect transistors (FETs), which has recently emerged, is nanowire transistor devices. Nanowire transistor devices use one or more nanowires as a channel region extending between a source region and a drain region. The nanowires typically have diameters that are on the order of ten nanometers or less, thereby allowing for the formation of a transistor device that is much smaller than that achievable using conventional silicon technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
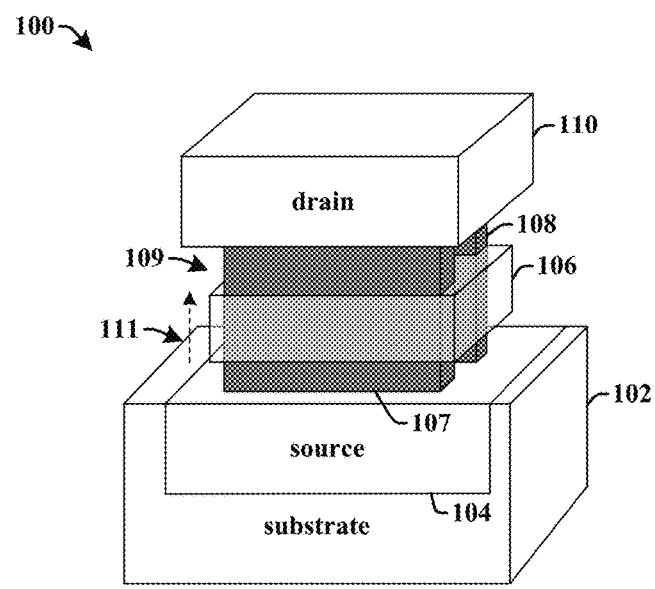
FIGS. 1A-1C illustrate some embodiments of a vertical transistor device having vertical channel bars with a rectangular shape extending between a source region and a drain region.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Vertical nanowire transistor devices often comprise a nanowire having a circular or square cross-section, which is vertically disposed between an underlying source region and an overlying drain region. During operation of a vertical nanowire transistor, a voltage applied to a gate region (i.e., a gate electrode) surrounding the nanowire at a position vertically located between the source region and the drain region, may cause current to either flow through the nanowire or be pinched off.

Because of the small size of nanowires (e.g., typically between 0.1 nm and 10 nm), single nanowires are unable to carry enough current between a source region and a drain region to make an efficient transistor device. Therefore, often a plurality of parallel nanowires are located between a source region and a drain region of a same vertical transistor device. Since the plurality of parallel nanowires are under the control of a same gate region, the plurality of parallel nanowires are able to operate as a single transistor device.

The present disclosure relates to a vertical transistor device with improved performance and cell area density, comprising vertical channel bars having a rectangular shape extending between a source region and a drain region, and an associated method of formation. In some embodiments, the vertical transistor device comprises a source region disposed over a semiconductor substrate. A channel region comprising one or more vertical channel bars is disposed over the source region. The one or more vertical channel bars have a bottom surface abutting the source region that has a rectangular shape (i.e., a shape with four sides separated by four right angles, with adjacent sides having different length). The vertical transistor device further comprises a gate region overlying the source region at a position surrounding the one or more vertical channel bars, and a drain region disposed over the gate region and the one or more vertical channel bars. The rectangular shape of the vertical channel bars allows for improvements in performance and cell area density in the disclosed vertical transistor device, relative to a vertical transistors device using circular or square nanowires.

FIG. 1A illustrates a three-dimensional view of some embodiments of a vertical transistor device 100 having vertical channel bars 108 with a rectangular shape extending between a source region 104 and a drain region 110.

The vertical transistor device 100 comprises a source region 104 overlying a semiconductor substrate 102. In some embodiments, the source region 104 comprises a highly doped region having a first doping type (e.g., an n-type doping or a p-type doping with a doping concentration of greater than approximately $10^{17}$ atoms/cm$^3$). In various embodiments, the semiconductor substrate 102 may comprise any type of semiconductor body (e.g., silicon, silicon germanium (SiGe), SOI, etc.) such as a semiconductor wafer or one or more die on a wafer, as well as any other type of semiconductor and/or epitaxial layers formed thereon and/or otherwise associated therewith.

One or more vertical channel bars, 108a and 108b, are disposed over the source region 104. The one or more vertical channel bars, 108a and 108b, form a channel region 109 of the vertical transistor device 100. The one or more vertical channel bars, 108a and 108b, have a bottom surface 107 abutting a top surface of the source region 104. The bottom surface 107 has a rectangular shape with adjacent sides having un-equal lengths. In some embodiments, the one or more vertical channel bars, 108a and 108b, have a second doping type that is different than the first doping type (e.g., a p-type doping or an n-type doping) of the source region 104. In other embodiments, the one or more vertical channel bars, 108a and 108b, may comprise a non-doped material. In some embodiments, the vertical channel bars, 108a and 108b, may comprise a semiconductor material such as silicon (Si), silicon germanium (SiGe), germanium (Ge), indium arsenide (InAs), Gallium arsenide (GaAs), etc. Although vertical transistor device 100 illustrates two vertical channel bars, 108a and 108b, it will be appreciated that such an embodiment is not intended in a limiting sense. Rather, a disclosed vertical transistor device 100 may have any number of vertical channel bars (e.g., 1, 2, 3, 4, etc.).

A drain region 110 is disposed over the one or more vertical channel bars, 108a and 108b. The drain region 110 abuts a top surface (opposing bottom surface 107) of the vertical channel bars, 108a and 108b, such that the vertical channel bars, 108a and 108b, extend between the source region 104 and the drain region 110. In some embodiments, the drain region 110 comprises a highly doped region having the first doping type of the source region 104 (e.g., an n-type doping or a p-type doping with a doping concentration of greater than approximately $10^{17}$ atoms/cm$^3$).

A gate region 106 comprising a conductive material is vertically disposed between the source region 104 and the drain region 110 at a position adjacent to the one or more vertical channel bars, 108a and 108b. During operation of the vertical transistor device 100, a voltage may be selectively applied to the gate region 106. The applied voltage causes the gate region 106 to control the flow of charge carriers 111 along the vertical channel bars, 108a and 108b, between the source region 104 and the drain region 110. In some embodiments, the gate region 106 surrounds the one or more vertical channel bars, 108a and 108b, so as to form a gate-all-around (GAA) transistor device.

Figure 1B:
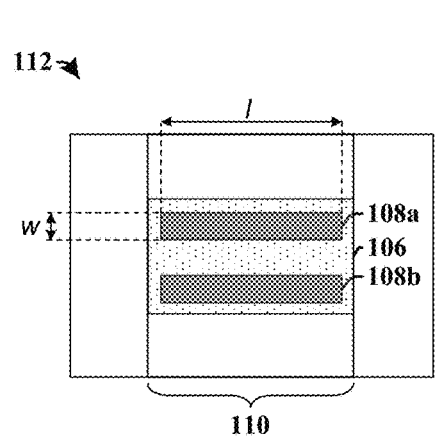

FIG. 1B illustrates some embodiments of a top-view 112 of the vertical transistor device 100.

As shown in top-view 112, the vertical channel bars, 108a and 108b, that are disposed between the source region 104 and the drain region 110 have a rectangular shape with four sides separated by right angles. The rectangular shape of the vertical channel bars, 108a and 108b, causes adjacent sides to have different lengths. For example, the vertical channel bars, 108a and 108b, respectively have a first two opposing sides with a length l and a second two opposing sides with a width w, wherein the length l has a larger value than the width w. In some embodiments, the first two opposing sides of the plurality of vertical channel bars, 108a and 108b, are oriented in parallel to each other in an area over the source region 104 (i.e., first two opposing sides of the first vertical channel bar 108a are oriented in parallel with first two opposing sides of the second channel bar 108b).

Figure 1C:
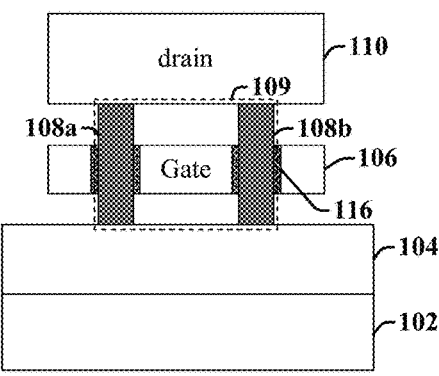

In some embodiments, the length l of the vertical channel bars, 108a and 108b, may be in a range of between approximately 4 times and approximately 20 times the value of the width w of the vertical channel bars, 108a and 108b. For example, in some embodiments, the length l may have a value that is between approximately 20 nm and approximately 100 nm and the width w may have a value that is between approximately 5 nm and approximately 10 nm. In other embodiments, the length l and width w may have smaller values or values that vary depending upon a desired transistor device characteristic. It will be appreciated that increasing an area in which the gate region 106 surrounds elements of the channel region 109 also increases the effective width the vertical transistor device 100. Therefore, the rectangular shape of the one or more vertical channel bars, 108a and 108b, increases the effective width ($W_{eff}$) of the channel region 109 relative to a vertical transistor device having square or circular nanowires FIG. 1C illustrates some embodiments of a side-view 114 of the vertical transistor device 100.

As shown in side-view 114, the gate region 106 surrounds the vertical channel bars, 108a and 108b, at a position that is vertically separated from the source region 104 and the drain region 110. The gate region 106 is separated from the vertical channel bars, 108a and 108b, by a gate dielectric layer 116 that abuts sidewalls of the vertical channel bars, 108a and 108b.

Figure 2A:
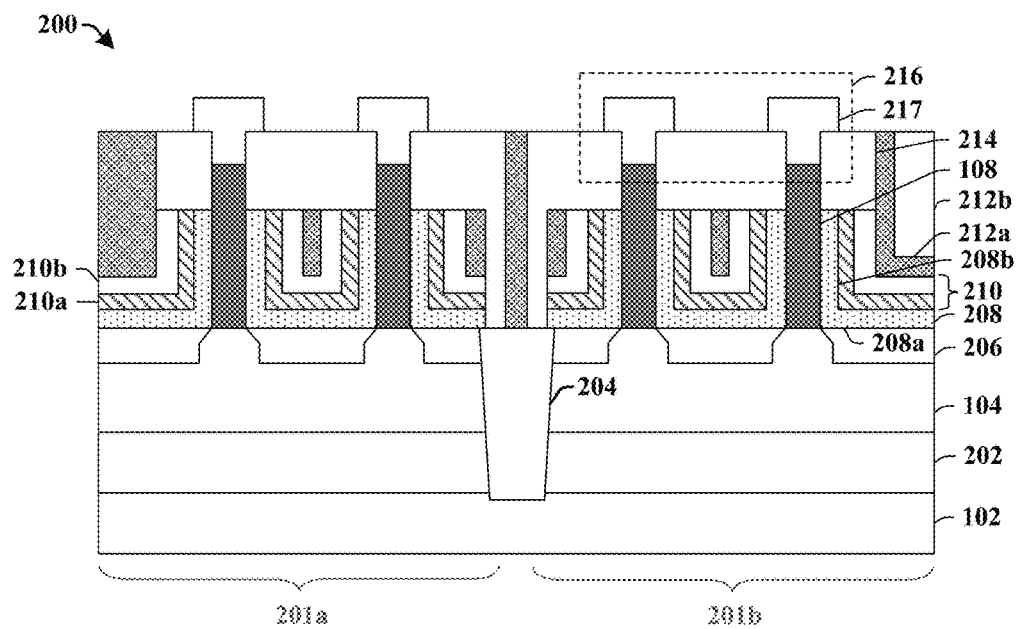
FIGS. 2A-2B illustrate some embodiments of an integrated chip comprising vertical transistor devices having vertical channel bars with a rectangular shape extending between a source region and a drain region.
Figure 2B:
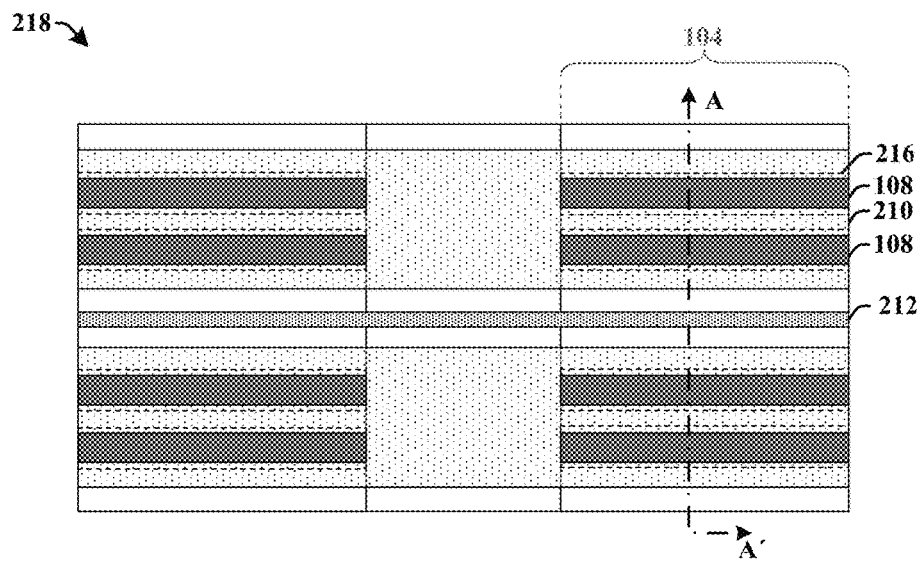

FIGS. 2A-2B illustrate some embodiments of an integrated chip 200 comprising vertical transistor devices, 201a and 201b, having vertical channel bars 108 with a rectangular shape extending between one or more source regions 104 and one or more drain regions 216.

FIG. 2A illustrates some embodiments of a side-view of the integrated chip 200.

The integrated chip 200 comprises an isolation region 204 (e.g., a shallow trench isolation region) disposed between source regions 104 of vertical transistor devices 201a and 201b. In some embodiments, the source regions 104 may be disposed within one or more well regions 202 located within a semiconductor substrate 102. In such embodiments, the source regions 104 have a different doping type than the one or more well regions 202 (e.g., the source regions 104 may have a first doping type, while the well region(s) 202 may have a second doping type different than the first doping type). A first insulating layer 206 is disposed over the source regions 104. In various embodiments, the first insulating layer 206 may comprise one or more different dielectric layers. In some embodiments, the first insulating layer 206 may comprise one or more of silicon-dioxide ($SiO_2$), silicon nitride (SiN), silicon carbon-nitride (SiCN), silicon carbon oxy-nitride (SiCON), etc.

A gate dielectric layer 208 is disposed over the first insulating layer 206. In some embodiments, the gate dielectric layer 208 may comprise a high-k gate dielectric material such as hafnium oxide (HfOx), zirconium oxide (ZrOx), or aluminum oxide ($Al_2O_3$), for example. The gate dielectric layer 208 may comprise an 'L' shaped structure having a horizontal leg 208a and a vertical leg 208b. The horizontal leg 208a is oriented in parallel to a top surface of the source regions 104 and the vertical leg 208b is oriented in parallel to a sidewall of vertical channel bars 108.

A gate region 210 is disposed over the gate dielectric layer 208. The first insulating layer 206 and the gate dielectric layer 208 are configured to electrically isolate the source region 104 from the gate region 210. The gate region 210 comprises a conductive material (e.g., metal or polysilicon). In some embodiments, the gate region 210 may comprise one or more different layers. For example, in some embodiments, the gate region 210 may comprise a first gate layer 210a comprising a gate work function layer including a material selected to give a vertical transistor device, 201a and 201b, a selected work function, and an overlying second gate layer 210b comprising a gate metal layer. In some embodiments, the first gate layer 210a may comprise titanium nitride (TiN), tantalum nitride (TaN), titanium aluminum carbide (TiAlC), tantalum aluminum carbide (TaAlC), etc. In some embodiments, the second gate layer 210b may comprise tungsten (W) or aluminum (Al), for example. In some embodiments, the gate region 210 may also comprise an 'L' shaped structure.

A dielectric layer 212 is disposed over the gate region 210. In various embodiments, the dielectric layer 212 may comprise one or more different dielectric layers. In some embodiments, the dielectric layer 212 may comprise a first dielectric layer 212a disposed onto the gate region 210, and an overlying inter-level (ILD) dielectric layer 212b. In some embodiments, the first dielectric layer 212a may comprise silicon nitride (SiN), silicon carbon nitride (SiCN), silicon carbon oxy-nitride (SiCON), etc. In some embodiments, the ILD layer 212b may comprise silicon dioxide ($SiO_2$), phosphorous silicon glass (PSG), boron silicon glass (BSG).

A drain spacer 214 is disposed over the gate region 210 and the dielectric layer 212 at positions laterally disposed between the vertical channel bars 108. The drain spacer 214 is configured to electrically isolate the gate region 210 from a drain region 216. In some embodiments, the drain region 216 may comprise one or more separate drain contacts 217 (e.g., a conductive material such as a metal). In some embodiments, the drain spacer 214 may comprise one or more of silicon dioxide ($SiO_2$), silicon nitride (SiN), silicon carbon nitride (SiCN), silicon carbon oxy-nitride (SiCON), for example.

FIG. 2B illustrates some embodiments of a top-view 218 of the integrated chip 200. As shown in the top-view 218, the side view of the integrated chip 200 (shown in FIG. 2A) is taken along cross-sectional line A-A'.

Figure 3:
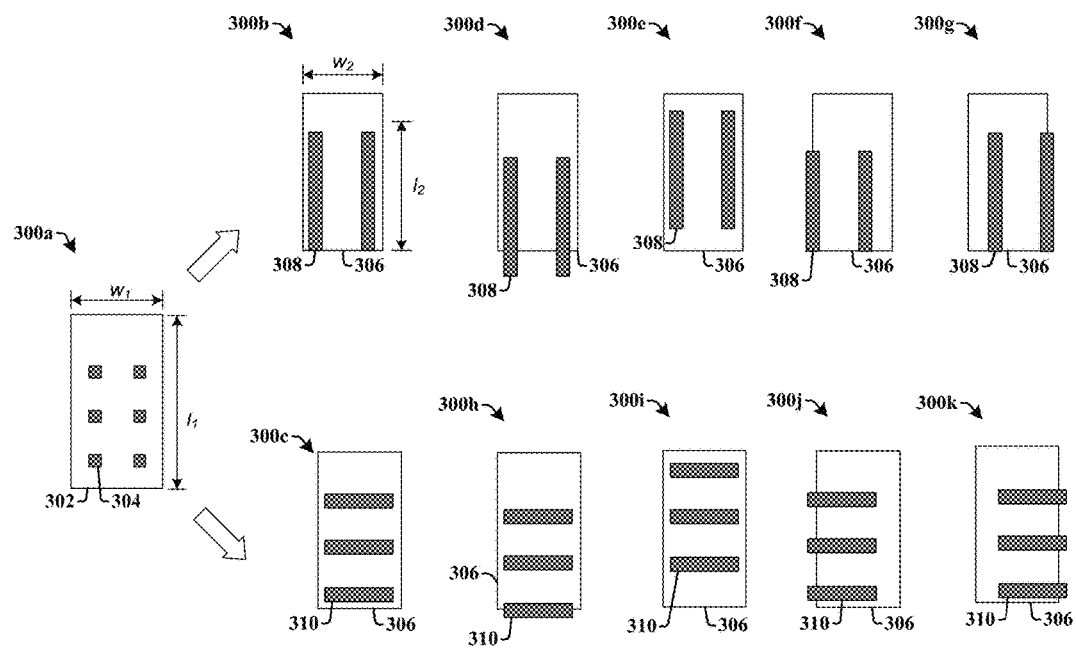
FIG. 3 illustrates various embodiments showing vertical channel bar configurations on a source region of a disclosed vertical transistor device.

FIG. 3 illustrates various embodiments of top-views, 300a-300c, showing vertical channel bar configurations on a source region of a disclosed vertical transistor device.

A first top-view 300a of a vertical transistor device illustrates a plurality of single wire channels 304 located over a source region 302. The plurality of single wire channels 304 have square cross-sections (e.g., have four sides with equal lengths). Spacing between the plurality of single wire channels 304 causes the source region 302 to have a length $l_1$ and a width $w_1$.

A second top-view 300b of a vertical transistor device illustrates a plurality of vertical channel bars 308 located over a source region 306. The plurality of vertical channel bars 308 have rectangular cross-sections with a length that extends in a direction that is parallel to a length (i.e., a larger dimension) of the source region 306 (i.e., so that a long side of the plurality of vertical channel bars 308 is oriented in parallel with a long side of the source region 306).

Spacing between the plurality of vertical channel bars 308 causes the source region 306 to have a length $l_2$ and width $w_2$, which are respectively smaller than the length $l_1$ and width $w_1$ of the vertical transistor device shown in top-view 300a (since the vertical channel bars 308 are formed by a self aligned process as described in relation to method 600). In some embodiments, replacement of the plurality of single wire channels 304 with the plurality of vertical channel bars 308 could reduce a size of a source region by 1.2 times or more.

A third top-view 300c of a vertical transistor device illustrates a plurality of vertical channel bars 310 located over a source region 306. The plurality of vertical channel bars 310 have rectangular cross-sections with a length that extend in a direction that is perpendicular to a length (i.e., a larger dimension) of the source region 306 (i.e., that is perpendicular to vertical channel bars 308).

Top-views 300d-300k illustrate alternative embodiments of vertical transistor devices having a plurality vertical channel bars 308 located at different locations over a source region 306. In various embodiments, the plurality of vertical channel bars 308 may have different locations over the source region 306 for various reasons. For example, in some embodiments, the different location of the vertical channel bars 308 relative to the source region 306 may be due to misalignment during fabrication. In such embodiments, the replacement of the plurality of single wire channels 304 with the plurality of vertical channel bars 308 can mitigate alignment problems due to the length of the vertical channel bars 308 (e.g., since even with misalignment, the plurality of vertical channel bars 308 still have a large intersection with the source region 306, so as to mitigate misalignment issues).

Figure 4:
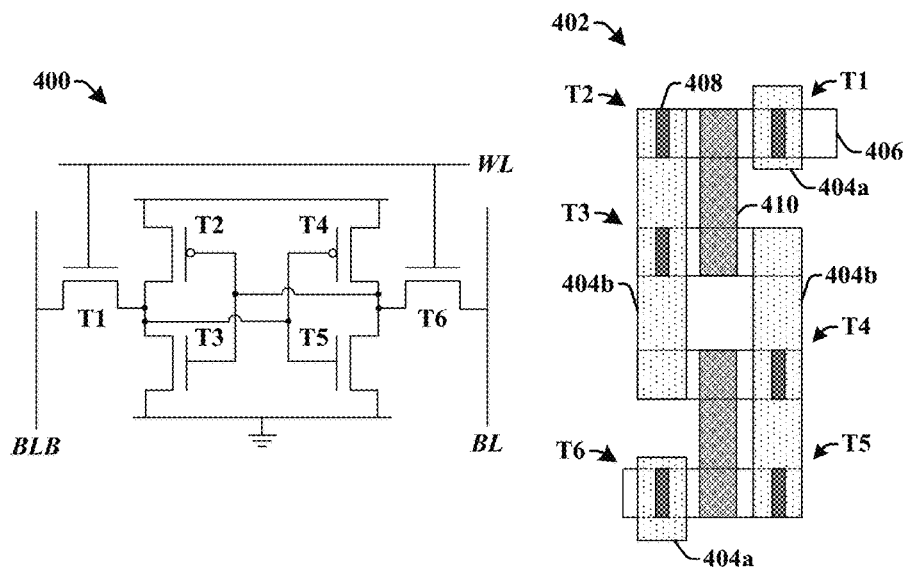
FIG. 4 illustrates some embodiments of an exemplary SRAM layout using a disclosed vertical transistors device with vertical channel bars.

FIG. 4 illustrate some embodiments of schematic diagram 400 of an 6 T SRAM (static random access memory) cell and a corresponding exemplary SRAM layout 402 comprising vertical transistors devices having vertical channel bars.

As illustrated in schematic diagram 400, the 6 T SRAM cell comprises six transistor devices T1-T6. Transistors T2, T3, T4, and T5 form two cross-coupled inverters (e.g., a first inverter comprising T2 and T3 and a second inverter comprising T4 and T5) configured to store data. Two additional access transistors T1 and T6 serve to control access to the SRAM cell during read and write operations by way of bit lines BL, BLB and word lines WL.

The SRAM layout 402 comprises gate regions, 404a and 404b, overlying active regions 406, which may be connected by a conductive path 410. Vertical channel bars 408 are configured to extend through gate regions 404a to form access transistors T1 and T6. Vertical channel bars 408 are configured to extend through gate regions 404b to form transistors T2, T3, T4, and T5. By using vertical channel bars 408 to form transistors T1-T6, the size of the SRAM layout 402 can be reduced relative to SRAMs using transistors devices having single wire channels.

Figure 5:
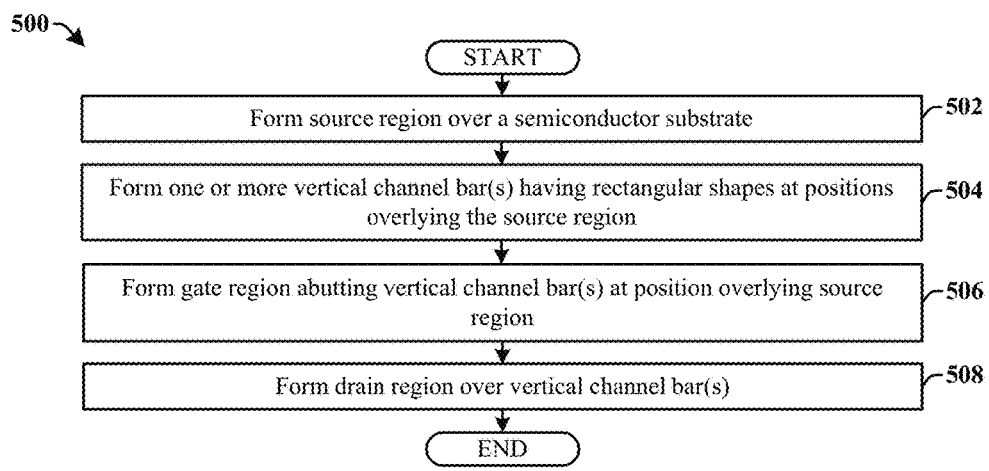
FIG. 5 illustrates a flow diagram of some embodiments of a method of forming a vertical transistor device having vertical channel bars with a rectangular shape extending between a source region and a drain region.

FIG. 5 illustrates a flow diagram of some embodiments of a method 500 of forming a vertical transistor device having vertical channel bars with a rectangular shape extending between a source region and a drain region.

While disclosed methods (e.g., methods 500 and 600) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a source region is formed over a semiconductor substrate.

At 504, one or more vertical channel bar(s) having rectangular shapes are formed at positions overlying the source region. The rectangular shape of the vertical channel bars causes adjacent sides of the vertical channel bars to have different lengths.

At 506, a gate region is formed to abut the one or more vertical channel bar(s) at positions overlying the source region.

At 508, a drain region is formed over the one or more vertical channel bar(s). By forming the drain region over the one or more vertical channel bar(s), the one or more vertical channel bar(s) extend between the source region and the drain region.

Figure 6:
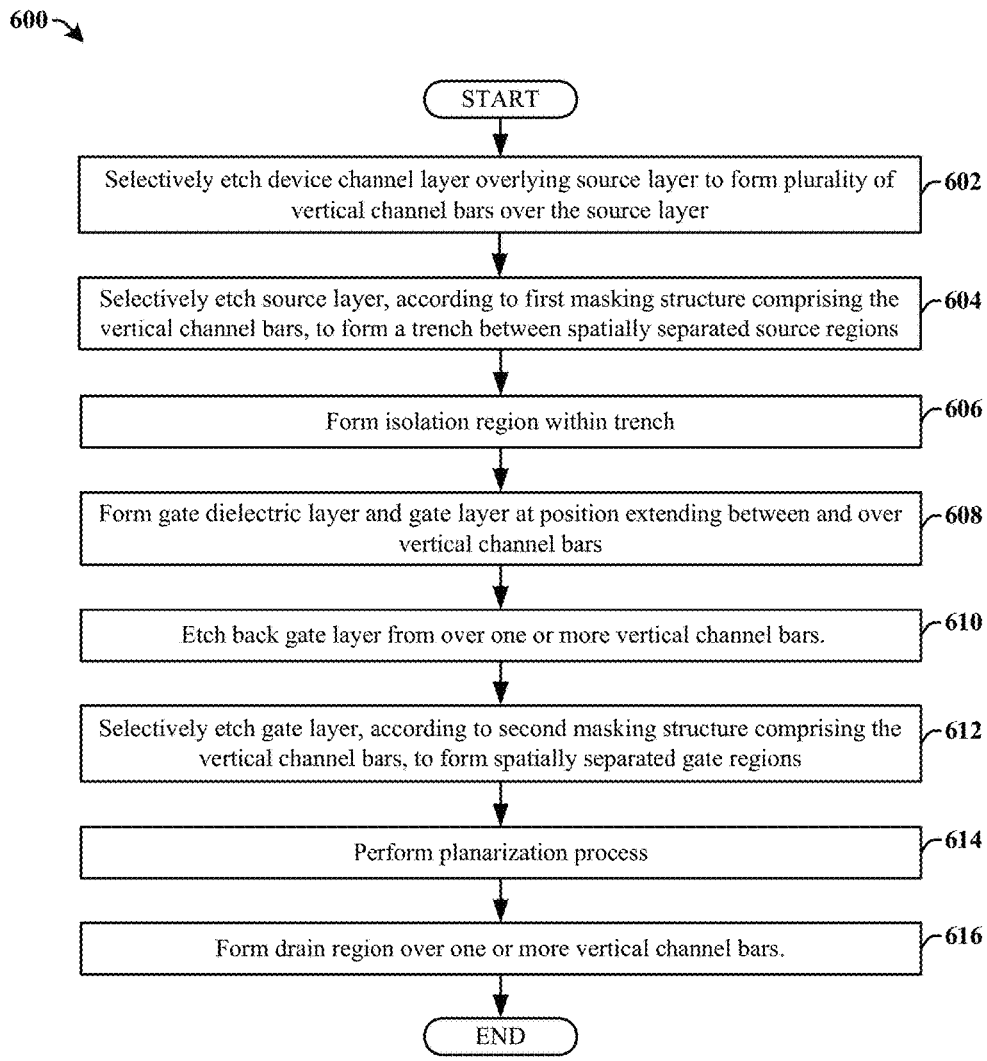
FIG. 6 illustrates a flow diagram of some alternative embodiments of a method of forming an integrated chip having vertical transistor devices with vertical channel bars having a rectangular shape extending between a source region and a drain region.

FIG. 6 illustrates a flow diagram of some alternative embodiments of a method 600 of forming an integrated chip having vertical transistor devices with vertical channel bars having a rectangular shape extending between a source region and a drain region.

At 602, a device channel layer overlying a source layer is selectively etched to form a plurality of vertical channel bars over the source layer.

At 604, the source layer is selectively etched, according to a first masking structure comprising the vertical channel bars, to form a trench that spatially separates source regions of adjacent vertical transistor devices.

At 606, an isolation region is formed within the trench.

At 608, a gate dielectric layer and a gate layer are formed onto the substrate at positions that extend between and over the vertical channel bars.

At 610, the gate layer is etched back from over the one or more vertical channel bars.

At 612, the gate layer is selectively etched, according to a second masking structure comprising the vertical channel bars, to form spatially separate gate regions of adjacent vertical transistor devices.

At 614 a planarization process is performed.

At 616, a drain region is formed over the one or more vertical channel bars.

FIGS. 7-18 illustrate some embodiments of cross-sectional views showing a method of forming a vertical transistor device having vertical channel bars with a rectangular shape extending between a source region and a drain region. Although FIGS. 7-18 are described in relation to the method 600, it will be appreciated that the structures disclosed in FIGS. 7-18 are not limited to the method 600, but instead may stand alone as structures independent of the method 600. Similarly, although the method 600 is described in relation to FIGS. 7-18, it will be appreciated that the method 600 is not limited to the structures disclosed in FIGS. 7-18, but instead may stand alone independent of the structures disclosed in FIGS. 7-18.

Figure 7:
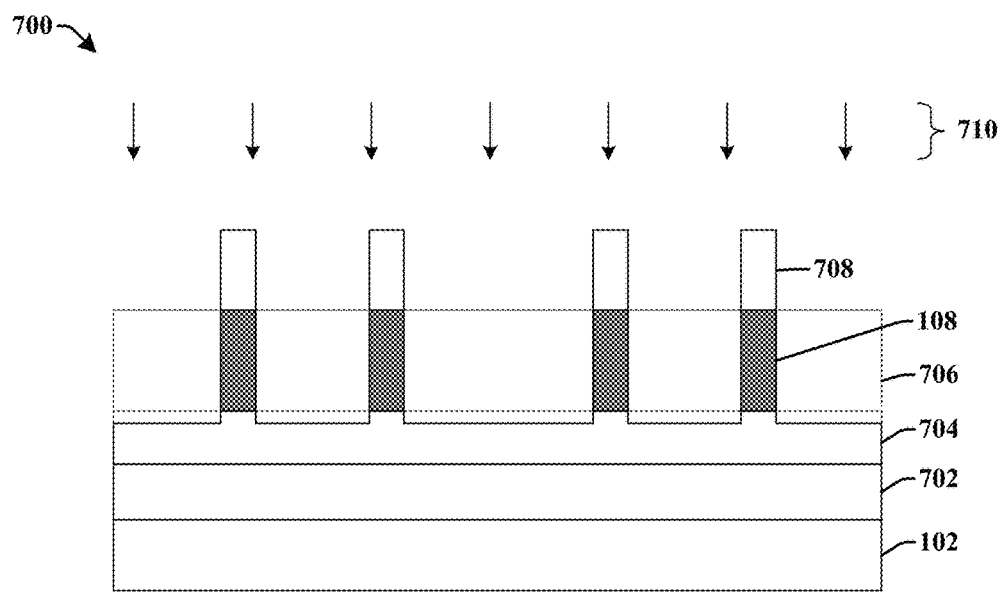
FIGS. 7-18 illustrate some embodiments of cross-sectional views showing a method of forming a vertical transistor device having vertical channel bars with a rectangular shape extending between a source region and a drain region.

FIG. 7 illustrates some embodiments of a cross-sectional view 700 corresponding to act 602.

As shown in cross-sectional view 700, a device channel layer 706 is disposed on a source layer 704 located over a semiconductor substrate 102. In some embodiments, the source layer 704 may be formed by selectively implanting the semiconductor substrate 102 with a dopant species. In some embodiments, the source layer 704 may be disposed within a well region 702 formed within the semiconductor substrate 102. In such embodiments, the source layer 704 has a different doping type than the well region 702. For example, the source layer 704 may have a first doping type, while the well region 702 may have a second doping type different than the first doping type. In various embodiments, the device channel layer 706 may comprise silicon (Si), silicon germanium (SiGe), germanium (Ge), etc.

A masking layer 708 is selectively formed over the device channel layer 706 at positions that define one or more vertical channel bars 108 (e.g., the masking layer 708 may be formed at positions that overlie the positions of the vertical channel bars 108). The device channel layer 706 is then exposed to a first etchant 710. The first etchant 710 is configured to remove the device channel layer 706 from areas not covered by the masking layer 708, resulting in the formation of the one or more vertical channel bars 108 on the source layer 704. In some embodiments, the first etchant 710 may comprise a wet etchant (e.g., having diluted hydrochloric acid (HCl)) or a dry etchant (e.g., having an etching chemistry comprising one or more of fluorine (F), Tetrafluoromethane ($CF_4$), ozone ($O_2$), or $C_4F_8$ (Octafluorocyclobutane)).

Figure 8:
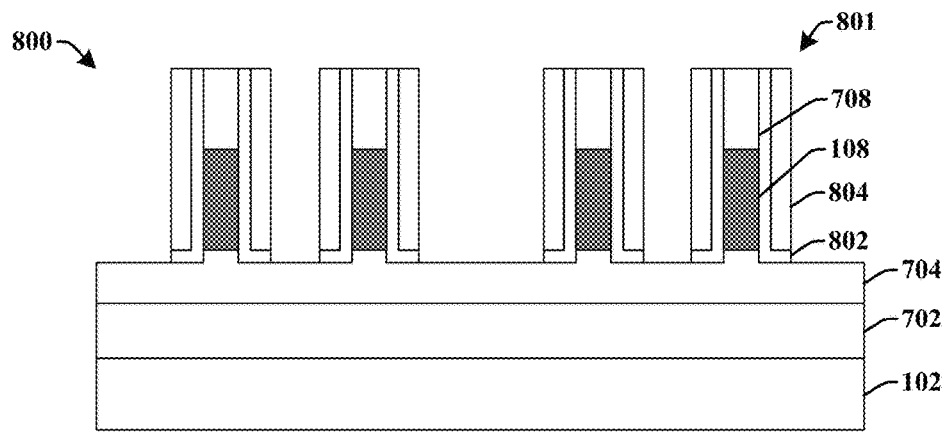
Figure 9:
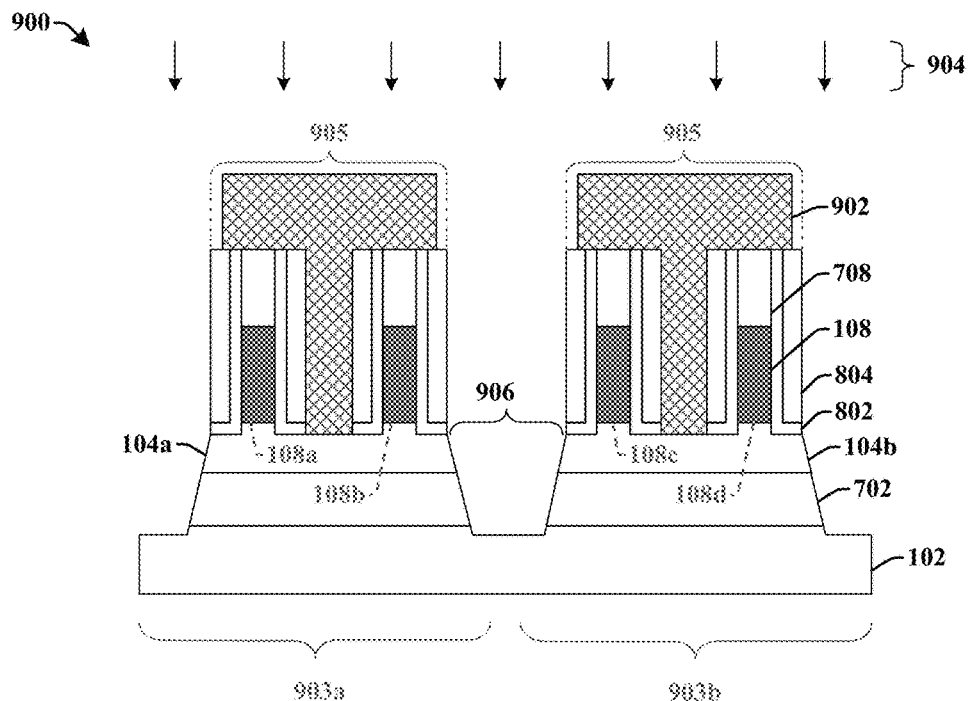

FIGS. 8-9 illustrate some embodiments of cross-sectional views, 800 and 900, corresponding to act 604.

As shown in cross-sectional view 800, vertical channel bar spacers 801 are formed on opposing sides of the vertical channel bars 108. The vertical channel bar spacers 801 may be formed by depositing one or more dielectric layers. For example, a first dielectric layer 802 and a second dielectric layer 804 may be deposited between the vertical channel bars 108. After deposition, the first and second dielectric layers, 802 and 804, may be selectively etched, using an anisotropic etch, to form the vertical channel bar spacers 801. The anisotropic etch results in the formation of vertical channel bar spacers 801 on sidewalls of the vertical channel bars 108.

As shown in cross-sectional view 900, a photoresist layer 902 is formed between the vertical channel bars 108 of a same vertical transistor device. For example, as shown in cross-sectional view 800, vertical channel bars 108a and 108b are shared by a first vertical transistor device 903a, while vertical channel bars 108c and 108d are shared by a second vertical transistor device 903b. The vertical channel bar spacers 801, the photoresist layer 902, and the vertical channel bars 108, collectively form a first masking structure 905.

After formation of the photoresist layer 902, the source layer 704 is selectively exposed to a second etchant 904, which is configured to etch the source layer 704 according to the first masking structure 905 to form a trench 906 located between spatially separated source regions, 104a and 104b, of adjacent vertical transistor devices, 903a and 903b. By using the vertical channel bar spacers 801 as part of the first making structures 905 that defines the spatially separated source regions, 104a and 104b, can be formed close together, thereby allowing for source regions, 104a and 104b, having a relatively small area.

Figure 10:
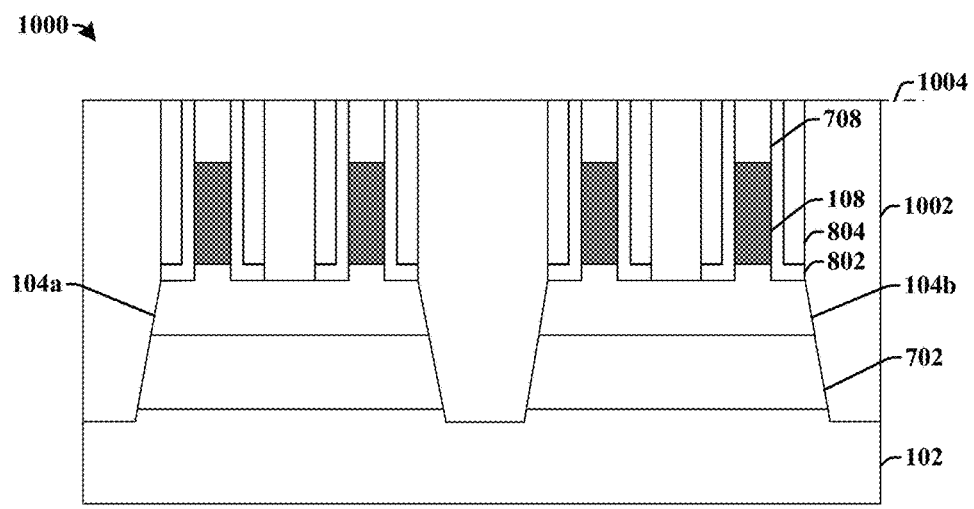
Figure 11:
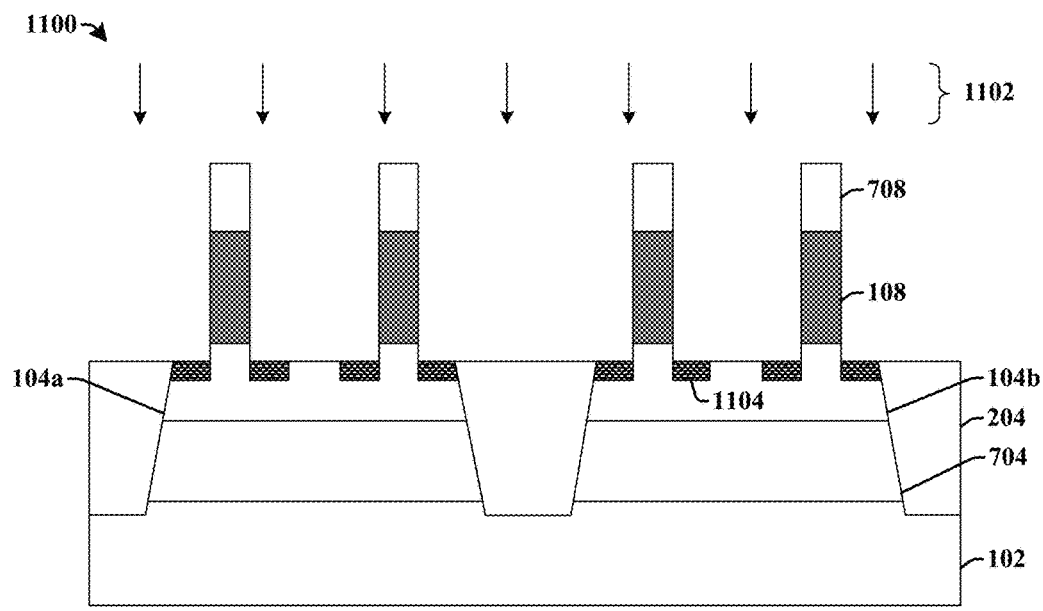

FIGS. 10-11 illustrate some embodiments of cross-sectional views, 1000 and 1100, corresponding to act 606.

As shown in cross-sectional view 1000, a dielectric material 1002 is formed within the trench 906 and between adjacent vertical channel bars 108. In some embodiments, the dielectric material 1002 may comprise an oxide formed by way of a deposition process. A planarization process is then performed. The planarization process removes excess of the dielectric material 1002 and/or masking layer 708, thereby forming a planar top surface 1004.

As shown in cross-sectional view 1100, the dielectric material 1002 is exposed to a third etchant 1102 configured to etch back the dielectric material 1002 to form an isolation region 204 (e.g., a shallow trench isolation region) at a position laterally between the spatially separated source regions, 104a and 104b. In some embodiments, the isolation region 204 may have a top surface that is aligned with a top surface of the spatially separated source regions, 104a and 104b. The vertical channel bar spacers 801 are also removed (e.g., by selective etching) after the etch back. In some embodiments, a source silicide layer 1104 may be formed within the spatially separated source regions, 104a and 104b, at positions adjacent to the vertical channel bars 108. Although the source silicide layer 1104 is illustrated as being formed in cross-sectional view 1100, it will be appreciated that in other embodiments, it may be formed at other points in the process.

Figure 12:
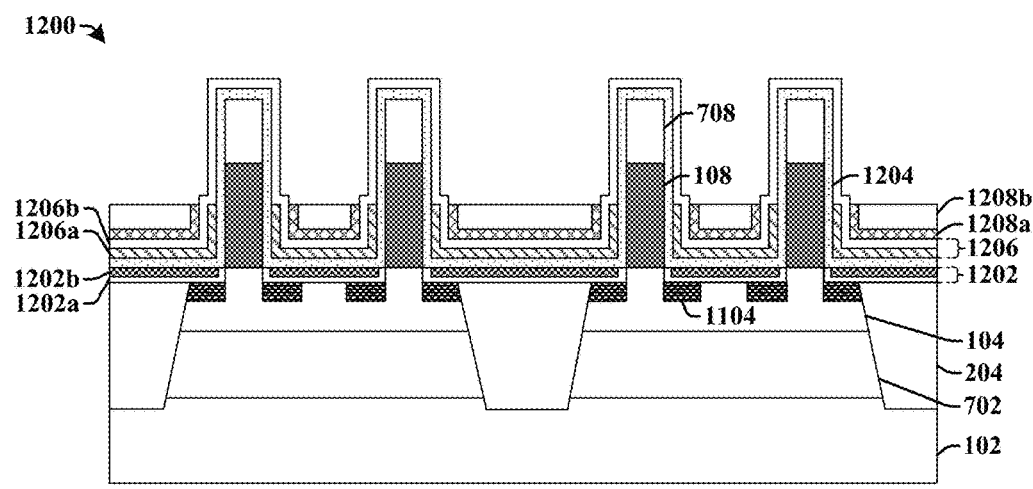

FIG. 12 illustrates some embodiments of a cross-sectional view 1200 corresponding to act 608.

As shown in cross-sectional view 1200, an insulating layer 1202 is formed over the spatially separated source regions, 104a and 104b, and the isolation region 204. In various embodiments, the insulating layer 1202 may comprise a first insulating layer 1202a and an overlying second insulating layer 1202b. In some embodiments, the first and second insulating layers, 1202a and 1202b, may comprise one or more of silicon-dioxide ($SiO_2$), silicon nitride (SiN), silicon carbon-nitride (SiCN), silicon carbon oxy-nitride (SiCON), etc.

A gate dielectric layer 1204 is subsequently formed over the first insulating layer 1202 and a gate layer 1206 is formed over the gate dielectric layer 1204. The gate dielectric layer 1204 and the gate layer 1206 are formed at positions that extend between and over the vertical channel bars 108. In some embodiments, the gate dielectric layer 1204 and the gate layer 1206 may be formed by way of a vapor deposition technique (e.g., CVD, PVD, etc.) or by way of atomic layer deposition (ALD). In some embodiments, the deposition may cause the gate dielectric layer 1204 and the gate layer 1206 to comprise 'L' shaped structures. In some embodiments, the gate dielectric layer 1204 may comprise a high-k gate dielectric material (e.g., such as hafnium oxide (HfOx), zirconium oxide (ZrOx), Aluminum oxide (Al2O3), etc.). In some embodiments, the gate layer 1206 may include a first gate layer 1206a comprising a material (e.g., TiN, TaN, TiAlC, TaAlC, etc.) selected to adjust a work function of an associated transistor device, and an overlying second gate layer 1206b comprising a gate metal layer (e.g., W, Al, etc.).

In some embodiments, a dielectric layer 1208 may be disposed over the gate layer 1206. The dielectric layer 1208 may comprise a first dielectric layer 1208a and an overlying inter-level dielectric (ILD) layer 1208b. In some embodiments, the first dielectric layer 1208a may comprise silicon nitride (SiN), silicon carbon nitride (SiCN), silicon carbon oxy-nitride (SiCON), etc. In some embodiments, the ILD layer 1208b may comprise silicon dioxide, phosphorous silicon glass (PSG), boron silicon glass (BSG).

Figure 13:
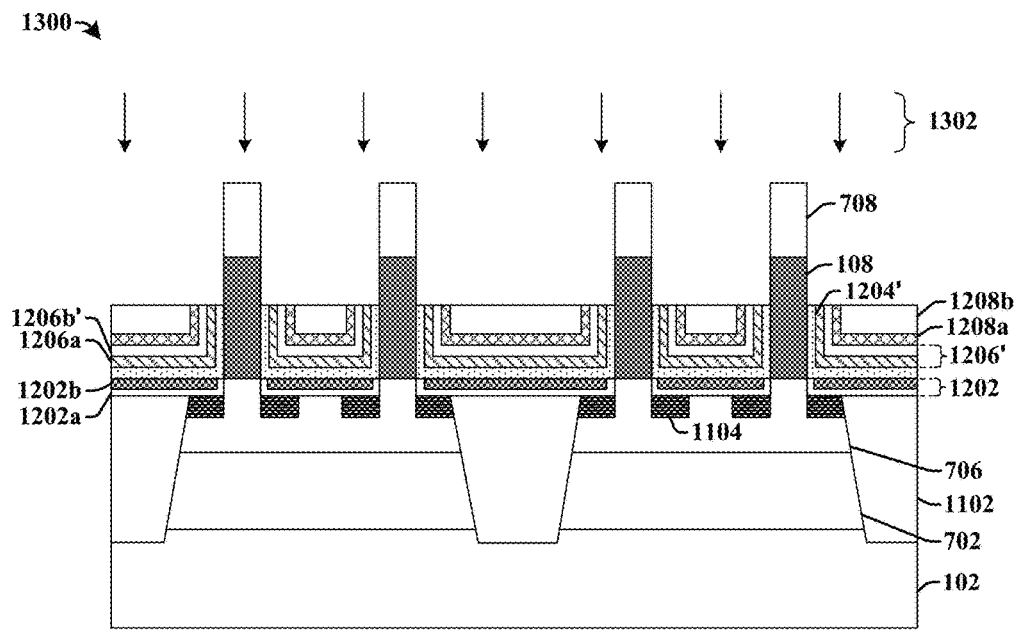

FIG. 13 illustrates some embodiments of a cross-sectional view 1300 corresponding to act 610.

As shown in cross-sectional view 1300, the gate dielectric layer 1204 and the gate layer 1206 are exposed to a fourth etchant 1302 configured to form a gate dielectric layer 1204' and the gate layer 1206' by etching back the gate dielectric layer 1204 and the gate layer 1206 from over one or more vertical channel bars 108. Etching back the gate dielectric layer 1204 and the gate layer 1206 exposes the vertical channels bars 108 in areas that are vertically over the dielectric layer 1208 (i.e., so that an upper part of the vertical channel bars 108 are surrounded by the gate dielectric layer 1204', while a second upper part of the vertical channel bars 108 are not surrounded by the gate dielectric layer 1204').

Figure 14:
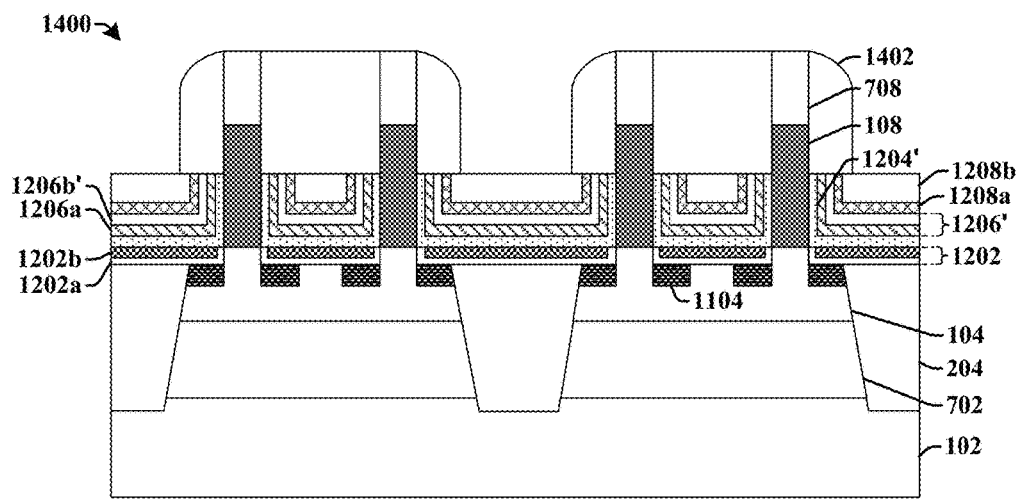
Figure 15:
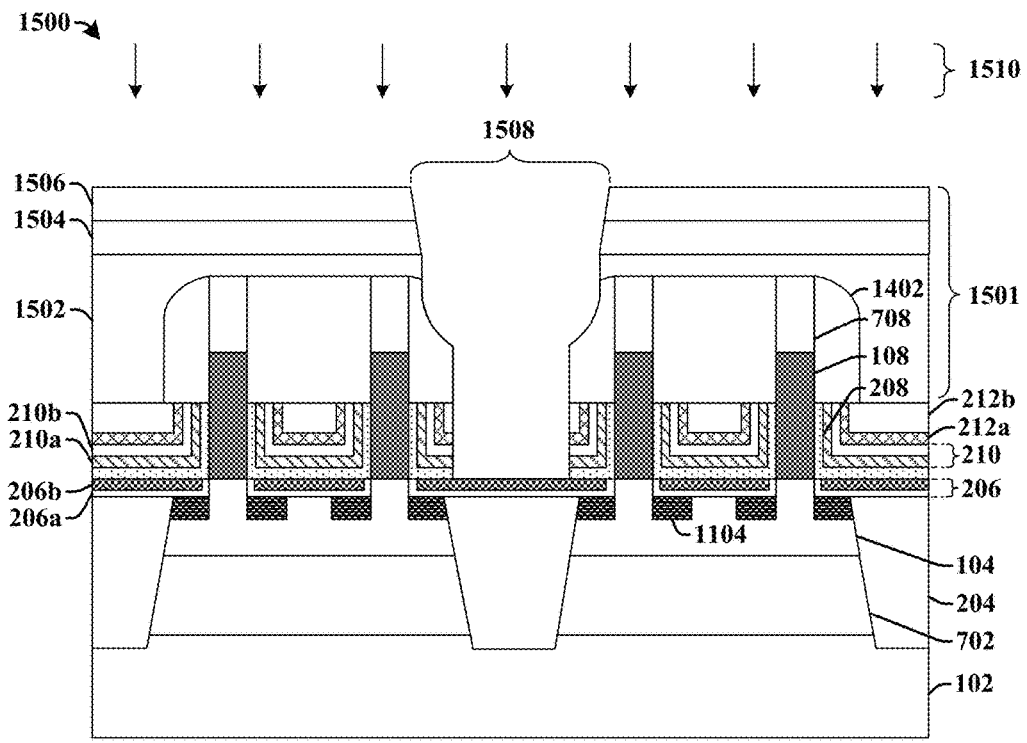
Figure 16:
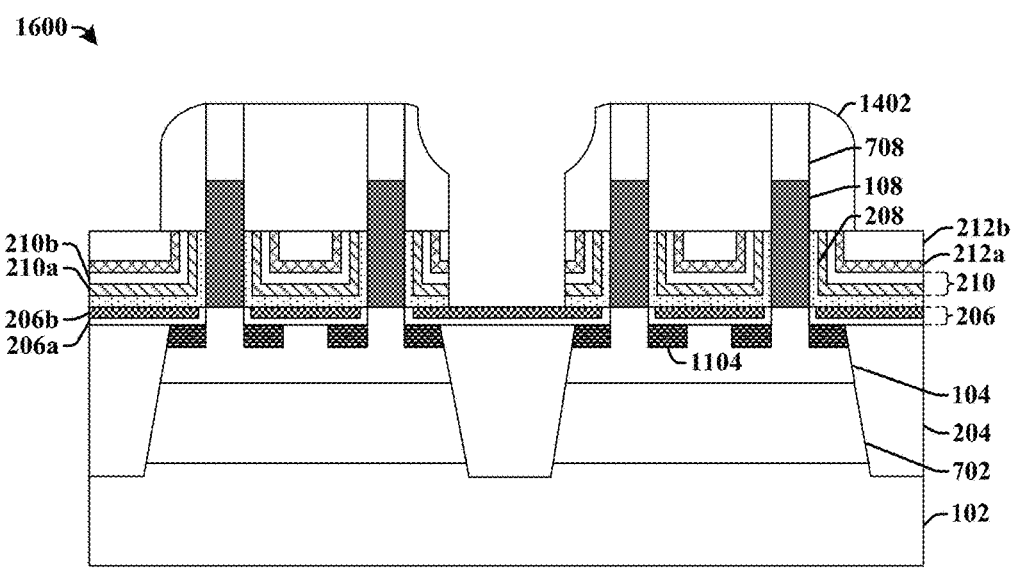

FIGS. 14-16 illustrates some embodiments of cross-sectional views, 1400-1600, corresponding to act 612.

As shown in cross-sectional view 1400, a spacer material comprising an electrically insulating material is deposited onto the substrate and selectively etched to form drain spacers 1402 on opposing sides of the vertical channel bars 108. In some embodiments, the drain spacers 1402 may comprise an oxide (e.g., silicon dioxide), silicon nitride (SiN), silicon carbon-nitride (SiCN), silicon carbon oxy-nitride (SiCON), etc.

As shown in cross-sectional view 1500, a patterning layer 1501 is formed over the drain spacers 1402 and the dielectric layer 212. The patterning layer 1501 may comprise one or more masking layers 1502-1506 formed over the dielectric layer 212. The drain spacers 1402, the vertical channel bars 108, and the patterning layer 1501 form a second masking structure used in selectively etching the gate layer 1206'. The gate layer 1206' is exposed to a fifth etchant 1510 according to the second masking structure to form a cavity 1508 that forms spatially separated gate regions 210 for adjacent vertical transistor devices. After etching, the patterning layer 1501 is removed, as shown in cross-sectional view 1600.

Figure 17:
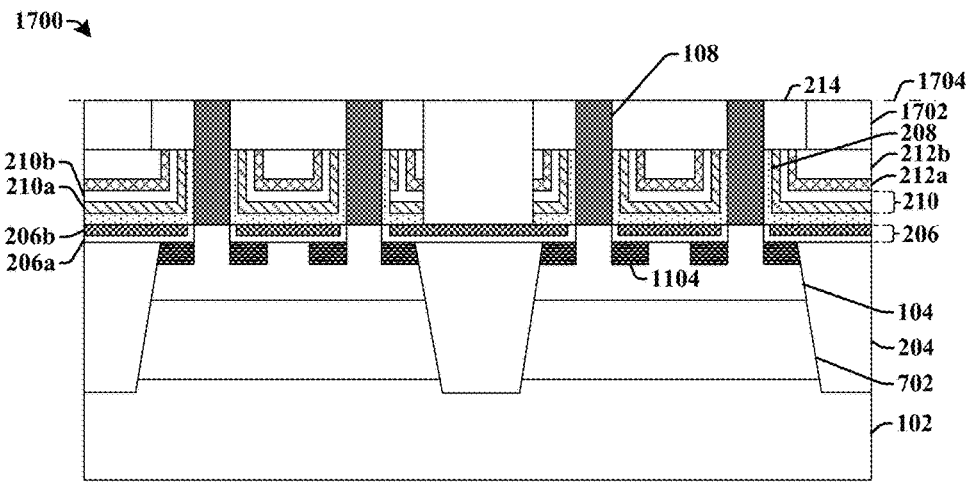

FIG. 17 illustrates some embodiments of a cross-sectional view 1700 corresponding to act 614.

As shown in cross-sectional view 1700, a planarization process is performed. In some embodiments, an additional ILD layer 1702 may be formed surrounding the drain spacers 1402 prior to the planarization process. The planarization process removes the masking layer 708 and a part of the drain spacers 214 and the additional ILD layer 1702, thereby forming a planar top surface 1704, and also defining a length of the vertical channel bars 108 between the spatially separated source regions, 104a and 104b, and a subsequently formed drain region.

Figure 18:
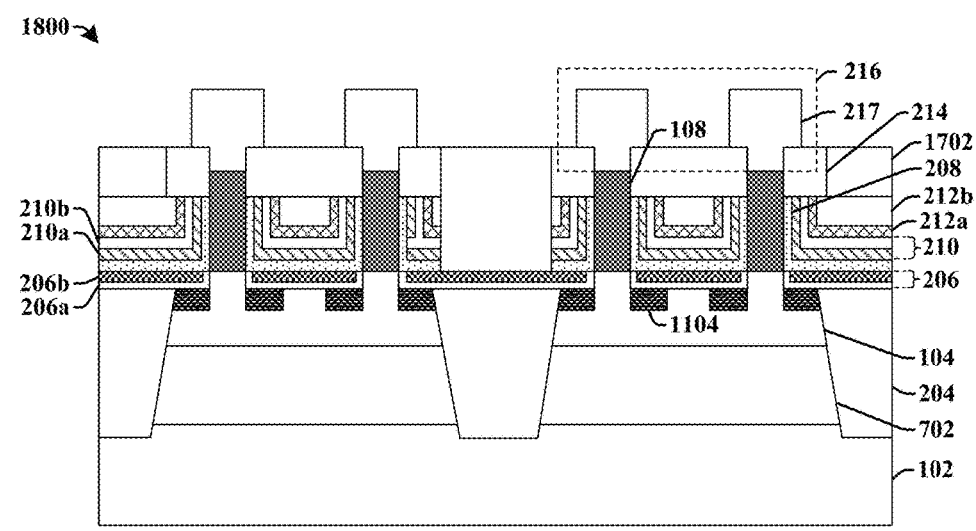

FIG. 18 illustrates some embodiments of a cross-sectional view 1800 corresponding to act 616.

As shown in cross-sectional view 1800, drain regions 216 are formed over one or more vertical channel bars 108. In some embodiments, the drain regions 216 may be formed by forming a doped silicon material over the vertical channel bars 108 and then selectively etching the doped silicon material to define the drain regions 216.

Therefore, the present disclosure relates to a vertical transistor device having vertical channel bars with an elongated rectangular shape, which extend between a source region and a drain region, and an associated method of formation.

In some embodiments, the present disclosure relates to a vertical transistor device. The vertical transistor device includes a source region over a substrate, and a vertical channel bar over the source region. The vertical channel bar has a bottom surface with an elongated shape. A conductive gate region is separated from sidewalls of the vertical channel bar by a gate dielectric layer. The conductive gate region comprises a vertical leg and a horizontal leg protruding outward from a sidewall of the vertical leg. A dielectric layer vertically extends from a plane extending along an uppermost surface of the conductive gate region to a position surrounded by the conductive gate region. A drain contact is over the vertical channel bar.

In other embodiments, the present disclosure relates to a vertical transistor device. The vertical transistor device includes a source region over a substrate, and a channel region over the source region. The channel region has a bottom surface with an elongated shape. A conductive gate region is separated from sidewalls of the channel region by a gate dielectric layer. The conductive gate region comprises a vertical leg and a horizontal leg protruding outward from a sidewall of the vertical leg. A drain contact is over the channel region, and a drain spacer is over the conductive gate region and below a lower surface of the drain contact. The drain spacer laterally surrounds the channel region and the drain contact. An inter-level dielectric (ILD) layer is laterally separated from the channel region and the drain contact by the drain spacer.

In yet other embodiments, the present disclosure relates to a vertical transistor device. The vertical transistor device includes a source structure over a substrate and a channel structure over the source structure. The channel structure has a bottom surface with an elongated shape. A conductive gate structure overlies the source structure at a position separated from sidewalls of the channel structure by a gate dielectric layer. The conductive gate structure comprises a vertical leg and a horizontal leg protruding outward from a sidewall of the vertical leg. The gate dielectric layer separates the conductive gate structure from a plane extending along a topmost surface of the source structure. A drain contact is over the channel structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A vertical transistor device, comprising:
   a source region over a substrate;
   a vertical channel bar over the source region, wherein the vertical channel bar has a bottom surface with an elongated shape;
   a conductive gate region separated from sidewalls of the vertical channel bar by a gate dielectric layer, wherein the conductive gate region comprises a vertical leg and a horizontal leg protruding outward from a sidewall of the vertical leg;
   a dielectric layer vertically extending from a plane extending along an uppermost surface of the conductive gate region to a position surrounded by the conductive gate region; and
   a drain contact over the vertical channel bar.

2. The device of claim 1,
   wherein the source region comprises a protrusion extending outward from an upper surface of the source region at a location directly under the vertical channel bar; and
   wherein the protrusion has a tapered sidewall that causes a width of the protrusion to decrease as a distance from the vertical channel bar decreases.

3. The device of claim 2, wherein the vertical channel bar has a maximum width that is smaller than a maximum width of the protrusion.

4. The device of claim 1, further comprising:
   a second source region over the substrate;
   a second vertical channel bar over the second source region, wherein the second vertical channel bar has a bottom surface with a second elongated shape;
   a second conductive gate region separated from sidewalls of the second vertical channel bar by a second gate dielectric layer; and
   an isolation structure separating the source region from the second source region.

5. The device of claim 4, wherein the conductive gate region is laterally separated from the second conductive gate region by a dielectric material that overlies the isolation structure.

6. The device of claim 4, further comprising:
   a drain spacer over the conductive gate region and below a lower surface of the drain contact; and
   an inter-level dielectric (ILD) layer extending from a plane extending along an uppermost surface of the drain spacer to between the conductive gate region and the second conductive gate region.

7. The device of claim 4, further comprising:
   an insulating layer on and in contact with a top surface of the isolation structure and below the conductive gate region and the second conductive gate region.

8. The device of claim 1, wherein the vertical channel bar laterally straddles an edge of the source region.

9. The device of claim 1, further comprising:
   an insulating layer on and in contact with the source region, wherein the insulating layer separates the source region from a bottom surface of the gate dielectric layer.

10. The device of claim 1, wherein the gate dielectric layer separates the conductive gate region from a plane extending along a topmost surface of the source region.

11. The device of claim 1, wherein the gate dielectric layer has a bottommost surface extending along a second plane that intersects the sidewalls of the vertical channel bar.

12. The device of claim 1,
    wherein the source region comprises a protrusion extending outward from an upper surface of the source region directly under the vertical channel bar; and
    wherein a source silicide layer is disposed within the source region at locations laterally surrounding the protrusion.

13. A vertical transistor device, comprising:
    a source region over a substrate;
    a channel region over the source region, wherein the channel region has a bottom surface with an elongated shape;
    a conductive gate region separated from sidewalls of the channel region by a gate dielectric layer, wherein the conductive gate region comprises a vertical leg and a horizontal leg protruding outward from a sidewall of the vertical leg;
    a drain contact over the channel region;
    a drain spacer over the conductive gate region and below a lower surface of the drain contact, wherein the drain spacer laterally surrounds the channel region and the drain contact; and
    an inter-level dielectric (ILD) layer laterally separated from the channel region and the drain contact by the drain spacer.

14. The device of claim 13,
wherein the source region comprises a protrusion extending outward from an upper surface of the source region at a location directly under the channel region; and
wherein the channel region has a maximum width that is smaller than a maximum width of the protrusion.

15. The device of claim 13, wherein the gate dielectric layer separates the conductive gate region from a plane extending along a topmost surface of the source region.

16. The device of claim 13, wherein the gate dielectric layer has a bottommost surface extending along a plane that intersects the sidewalls of the channel region.

17. A vertical transistor device, comprising:
a source structure over a substrate;
a channel structure over the source structure, wherein the channel structure has a bottom surface with an elongated shape;
a conductive gate structure overlying the source structure at a position separated from sidewalls of the channel structure by a gate dielectric layer, wherein the conductive gate structure comprises a vertical leg and a horizontal leg protruding outward from a sidewall of the vertical leg, and wherein the gate dielectric layer separates the conductive gate structure from a plane extending along a topmost surface of the source structure; and
a drain contact over the channel structure.

18. The device of claim 17, further comprising:
a drain spacer laterally surrounding the channel structure and the drain contact; and
an inter-level dielectric (ILD) layer laterally separated from the channel structure and the drain contact by the drain spacer.

19. The device of claim 17,
wherein the channel structure has a length extending in a first direction perpendicular to a normal vector extending from an upper surface of the source structure, and a width extending in a second direction perpendicular to the first direction and to the normal vector; and
wherein the length is in a range of between approximately 4 times and approximately 20 times the width.

20. The device of claim 17, wherein the gate dielectric layer has a bottommost surface extending along a second plane that intersects the sidewalls of the channel structure.

* * * * *